United States Patent
Sentoku et al.

(10) Patent No.: US 6,529,625 B2
(45) Date of Patent: *Mar. 4, 2003

(54) POSITION DETECTING METHOD AND POSITION DETECTING DEVICE FOR DETECTING RELATIVE POSITIONS OF OBJECTS HAVING POSITION DETECTING MARKS BY USING SEPARATE REFERENCE MEMBER HAVING ALIGNMENT MARKS

(75) Inventors: Koichi Sentoku, Utsunomiya (JP); Hideki Ina, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/083,962

(22) Filed: May 26, 1998

(65) Prior Publication Data

US 2001/0046315 A1 Nov. 29, 2001

(30) Foreign Application Priority Data

Jun. 2, 1997 (JP) .............................................. 9-159234

(51) Int. Cl.[7] .................................................. G06K 9/00
(52) U.S. Cl. .................................... 382/151; 250/559.3
(58) Field of Search ................................. 382/141, 144, 382/145, 148, 151, 287, 291; 348/87, 95; 356/375, 396, 237.4, 237.5, 620; 250/559.3; 702/150; 438/16

(56) References Cited

U.S. PATENT DOCUMENTS

| | | | | |
|---|---|---|---|---|
| 3,796,497 A | * | 3/1974 | Mathisen et al. ........... 356/152 |
| 3,950,094 A | * | 4/1976 | Kano et al. .................... 355/45 |
| 4,070,117 A | * | 1/1978 | Johannsmeier et al. ..... 356/172 |
| 4,861,162 A | | 8/1989 | Ina .............................. 356/401 |
| 4,883,359 A | | 11/1989 | Ina et al. ..................... 356/401 |
| 4,901,109 A | | 2/1990 | Mitome et al. ............... 355/68 |
| 5,369,486 A | | 11/1994 | Matsumoto et al. ........ 356/349 |
| 5,407,763 A | * | 4/1995 | Pai ................................. 430/5 |
| 5,543,921 A | | 8/1996 | Uzawa et al. ............... 356/401 |
| 5,717,492 A | | 2/1998 | Sentoku et al. ............. 356/401 |
| 5,815,594 A | * | 9/1998 | Tanaka ........................ 382/151 |
| 5,881,165 A | * | 3/1999 | Tanaka ........................ 382/151 |
| 5,940,528 A | * | 8/1999 | Tanaka et al. .............. 382/151 |
| 5,995,198 A | * | 11/1999 | Mizutani ..................... 355/53 |

FOREIGN PATENT DOCUMENTS

| | | |
|---|---|---|
| JP | 63-32303 | 2/1988 |
| JP | 2-130908 | 5/1990 |

* cited by examiner

*Primary Examiner*—Brian Werner
(74) *Attorney, Agent, or Firm*—Fitzpatrick, Cella, Harper & Scinto (57) ABSTRACT

A position detecting method and a position detecting device which make it possible to detect with high accuracy by an image processing method the relative positions of two objects spaced apart in the optical axis direction of a detection optical system, and a semiconductor device manufacturing method using the position detecting method and the position detecting device. In detecting the relative positions of a first object (e.g., a mask) and a second object (e.g., a wafer), there is provided a third object equipped with separate reference alignment marks, and optical images of the reference alignment marks on the third object and optical images of the position detecting marks on the first and second objects are detected by an image pickup device, thereby detecting positional deviation between the first and second objects.

28 Claims, 8 Drawing Sheets

PRIOR ART

POSITION DETECTING METHOD AND POSITION DETECTING DEVICE FOR DETECTING RELATIVE POSITIONS OF OBJECTS HAVING POSITION DETECTING MARKS BY USING SEPARATE REFERENCE MEMBER HAVING ALIGNMENT MARKS

BACKGROUND OF THE INVENTION

1. Field of the Invention

The present invention relates to a position detecting method and a position detecting device and, in particular, to a position detecting method and a position detecting device according to which, in an exposure device for manufacturing semiconductor devices, relative positioning (i.e., alignment) is effected between a first object, e.g., one consisting of a minute electronic circuit pattern, such as an IC, LSI or VLSI formed on a reticle or a mask surface, and a second object, e.g., one consisting of a wafer.

2. Description of the Related Art

As integrated circuits increase in density, a projection exposure device for manufacturing semiconductor devices is required to be capable of performing projection exposure of a circuit pattern onto a reticle surface with higher resolution. To improve the projection resolution of the exposure device, the wavelength of the exposure light is fixed and the NA (numeral aperture) of the projection optical system is increased, or the wavelength of the exposure light is shortened. For example, the wavelength is changed from that of the g-line to that of the i-line or from the wavelength of the i-line to that of an excimer laser.

Further, as the circuit pattern becomes more minute, there is a demand for more accurate alignment of the circuit pattern formed on the reticle and the pattern on the wafer. The alignment between the reticle and the wafer is effected either by using exposure light, to which the resist applied to the wafer surface is exposed, or by using non-exposure light, to which the resist is not exposed. An example of non-exposure light is light having a wavelength of 633 nm, which is the oscillation wavelength of a HeNe laser. Nowadays, the method using non-exposure light is mostly adopted due to the fact that it is advantageously not liable to be influenced by the semiconductor process.

The present applicant has proposed alignment devices using non-exposure light in Japanese Patent Laid-Open Nos. 63-32303, 2-130908, etc., which have been realized as products with recognized advantages. The method is called the TTL-off-axis system, in which the pattern on the wafer is observed with non-exposure light through the projection optical system for transfer-projecting the pattern of the reticle onto the wafer. During observation, the chromatic aberration generated by the projection optical system at the wavelength of non-exposure light is corrected by an alignment optical system. In another system, which is called the non-TTL-off-axis system, the wafer is observed for alignment with a completely independent optical system (off-axis microscope) without involving the projection optical system at all.

As is the case with the above applications, most of the alignment systems currently in use adopt a so-called image processing method, in which an image of a position detecting mark (alignment mark) on the wafer is formed on an image pickup device such as a CCD camera, and an electrical signal obtained from the image pickup device is processed to thereby detect the position of the wafer.

However, when the above-described position detecting method is applied to an X-ray exposure device using a proximity gap, it is difficult to simultaneously detect the optical image of the position detecting mark on the mask and the optical image of the position detecting mark on the wafer due to the presence of a gap between the mask and the wafer.

SUMMARY OF THE INVENTION

It is accordingly an object of the present invention to provide a position detecting device which is capable of detecting the relative positions of two objects spaced apart from each other in the optical-axis direction of the detection optical system, as in the proximity method, with high accuracy by the image processing method, and a semiconductor device manufacturing method using this device.

In view of the foregoing, in one aspect, the present invention relates to a position detecting device for detecting relative positions of first and second objects each equipped with a position detecting mark, the device comprising a reference member equipped with separate alignment marks corresponding to the position detecting marks of the first and second objects, respectively; and an image pickup system for simultaneously taking images of the position detecting marks of the first and second objects and the alignment marks corresponding thereto.

In another aspect, the present invention relates to a position detecting device for detecting a positional relationship between first and second objects arranged opposite to each other by using a first position detecting mark arranged on the first object and a second position detecting mark arranged on the second object, the position detecting device comprising a first illumination system for illuminating the first position detecting mark and the second position detecting mark, a reference member having alignment reference marks corresponding to the first and second position detecting marks, a second illumination system for illuminating the alignment reference marks, and an image taking system for taking optical images of the first and second position detecting marks and optical images of the alignment reference marks, wherein a positional relationship between the optical image of the first position detecting mark and the optical images of the alignment reference marks of the reference member is detected by using the image taking system, and wherein a positional relationship between the optical image of the second position detecting mark and the optical images of the alignment reference marks is detected by using the image taking system, whereby the detection of the relative positions of the first and second objects is executed.

In yet another aspect, the present invention relates to a method for detecting relative positions of first and second objects each equipped with a position detecting mark, the method comprising the steps of preparing separate reference alignment marks on a predetermined member, the alignment marks respectively corresponding to the position detecting marks of the first and second objects, and simultaneously taking images of the position detecting marks of the first and second objects and the alignment marks to obtain information on the relative positions of the first and second objects.

In yet a further aspect, the present invention relates to a position detecting method for detecting a positional relationship between first and second objects arranged opposite to each other by using a first position detecting mark arranged on the first object and a second position detecting mark arranged on the second object, the method comprising the steps of providing alignment reference marks on a predetermined reference member, the alignment reference marks respectively corresponding to the first and second position detecting marks, and taking optical images of the first and second position detecting marks and the alignment reference marks, wherein a positional relationship between the optical image of the first position detecting mark and the optical images of the alignment reference marks is detected by the image taking, and wherein a positional relationship between the optical image of the second position detecting mark and the optical images of the alignment reference marks is detected by the image taking, whereby the detection of the relative positions of the first and second objects is executed.

In still another aspect, the present invention relates to an exposure device for transferring a pattern of a first object through exposure onto a second object after performing alignment of the first and second objects, which objects are arranged opposite to each other, by detecting a positional relationship between the first and second objects by using a first position detecting mark arranged on the first object and a second position detecting mark arranged on the second object, the exposure device comprising a first illumination system for illuminating the first position detecting mark and the second position detecting mark, a reference member having alignment reference marks respectively corresponding to the first and second position detecting marks, a second illumination system for illuminating the alignment reference marks, and an image taking system for taking optical images of the first and second position detecting marks and optical images of the alignment reference marks, wherein a positional relationship between the optical image of the first position detecting mark and the optical images of the alignment reference marks is detected by using the image taking system, and wherein a positional relationship between the optical image of the second position detecting mark and the optical images of the alignment reference marks is detected by using the image taking system, whereby the detection of the relative positions of the first and second objects is executed.

In yet a still further aspect, the present invention relates to a device manufacturing method comprising (a) a position detecting process for detecting the positional relationship between first and second objects arranged opposite to each other by using a first position detecting mark arranged on the first object and a second position detecting mark arranged on the second object, the position detecting process comprising the steps of (1) providing alignment reference marks on a predetermined reference member, the alignment reference marks respectively corresponding to the first and second position detecting marks, and (2) taking optical images of the first and second position detecting marks and optical images of the alignment reference marks, wherein a positional relationship between the optical image of the first position detecting mark and the optical images of the alignment reference marks is detected the image taking, and wherein a positional relationship between the optical image of the second position detecting mark and the optical images of the alignment reference marks is detected by the image taking, whereby the detection of the relative positions of the first and second objects is executed, and (b) an exposure process for transferring the pattern of the first object through exposure onto the second object after alignment of the first object with the second object whose relative positions have been detected by the position detecting process, a device being formed by using the pattern exposed and transferred by the exposure process.

In another aspect, the present invention relates to a device for detecting alignment, in an optical axis direction, of a mask having a mask alignment mark and a wafer having a wafer alignment mark, the mask and the wafer being arranged along the optical axis spaced apart from and facing one another, the device comprising a plate separate from the mask and a wafer reference mark, an optical system for illuminating the mask alignment mark of the mask and the wafer alignment mark of the wafer with a first light source and for illuminating the mask reference mark of the plate and the wafer reference mark of the plate with a second light source separate from the first light source, and for forming images of the mask alignment mark and the mask reference mark on a first image pickup device and for forming images of the wafer alignment mark and the wafer reference mark on a second image pickup device separate from the first image pickup device, and a detector for detecting a first positional deviation between the mask alignment mark and the mask reference mark on the basis of a signal from the first image pickup device corresponding to the images thereof, for detecting a second positional deviation between the wafer alignment mark and the wafer reference mark on the basis of a signal from the second image pickup device corresponding to the images thereof, and for detecting a positional deviation in the optical axis direction between the mask and the wafer in accordance with the first and second positional deviations.

In still another aspect, the present invention relates to a position detecting apparatus for detecting relative positions of a mask equipped with mask position detecting mark and a wafer equipped with a wafer position detecting mark, the apparatus comprising means for illuminating the mask position detecting mark and the wafer position detecting mark to form images thereof on separate first and second image pickup devices, respectively, a plate having first and second alignment marks separated by a predetermined distance, means for illuminating the first and second alignment marks to form images thereof on the first and second image pickup devices, respectively, and means for determining a first positional deviation between the images of the mask position detecting mark and the first alignment mark in accordance with a signal from the first image pickup device, for determining a second positional deviation between the images of the wafer position detecting mark and the second alignment mark in accordance with a signal from the second image pickup device, and for determining a positional deviation of the mask and the wafer in accordance with the first and the second positional deviations and the predetermined distance between the first and second alignment marks.

These and other aspects, objects, advantages, and features of the present invention will become apparent from the following detailed description of preferred embodiments thereof taken in connection with the accompanying drawings.

DESCRIPTION OF THE PREFERRED EMBODIMENTS

Figure 1:
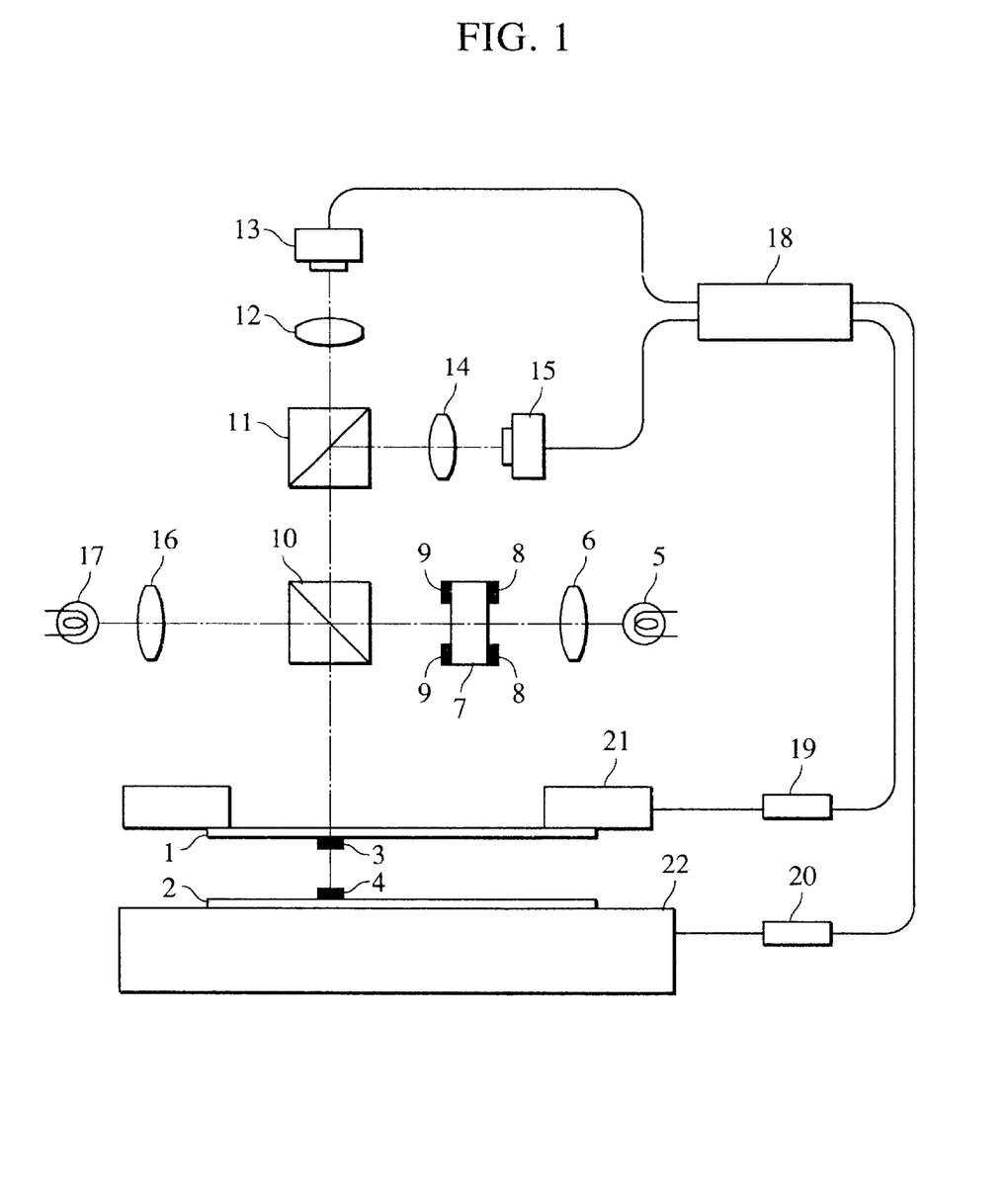
FIG. 1 is a schematic diagram of a main part of a device according to a first embodiment of the present invention.

FIG. 1 is a schematic diagram showing a position detecting device according to a first embodiment of the present invention as applied to a proximity type exposure device for manufacturing semiconductor devices. In the drawing, a mask 1 (first object) and a wafer 2 (second object) are arranged opposite to each other with a predetermined space therebetween. On the mask 1, there is arranged a mask position detecting mark 3 (first position detecting mark), and, on the wafer 2, there is arranged a wafer position detecting mark 4 (second position detecting mark). An illuminating beam from a light source 17 is applied to these position detecting marks (3 and 4) through an illumination optical system 16 and a beam splitter 10. An image of the mask position detecting mark 3, to which the illuminating beam is applied, is formed on an image pickup device 13 through the beam splitter 10, a beam splitter 11 and an imaging system 12. An illuminating beam from a light source 5 is applied to reference alignment marks 9 arranged on a reference alignment mark plate (third object) 7 through an illumination optical system 6. Images of the reference alignment marks 9, which are thus illuminated, are reflected by the beam splitter 10, and then are formed on the same image pickup device 13 through the beam splitter 11 and the imaging system 12.

Figure 2A:
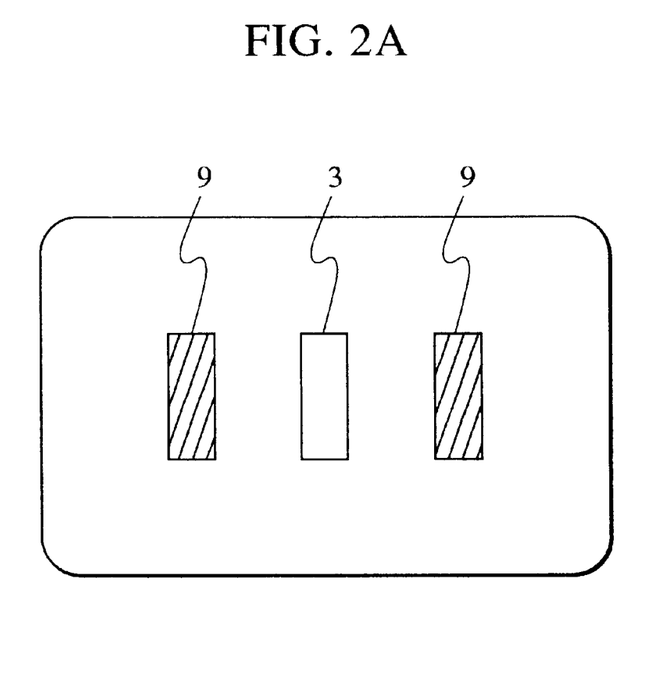
FIGS. 2A and 2B are diagrams illustrating an image observed in the first embodiment.

FIG. 2A shows the images of the mask position detecting mark 3 and the reference alignment marks 9 detected by the image pickup device 13. By performing image processing, for example, the image processing disclosed in U.S. Pat. No. 5,543,921 on the image information obtained by the image pickup device 13, it is possible to determine the position of the mask position detecting mark 3, that is, the position of the mask 1 with respect to the reference alignment marks 9.

An illuminating beam from the light source 17 is similarly applied to the wafer position detecting mark 4 through an illumination optical system 16 and the beam splitter 10. An image of the illuminated wafer position detecting mark 4 is reflected by the beam splitter 11 and formed on an image pickup device 15 through an imaging system 14.

Reference alignment marks 8 arranged on the plate 7 are illuminated by the light source 5. The images of the reference alignment marks 8 are reflected by the beam splitter 10 and are reflected by the beam splitter 11 before they are formed on the same image pickup device 15 through the imaging system 14.

Figure 2B:
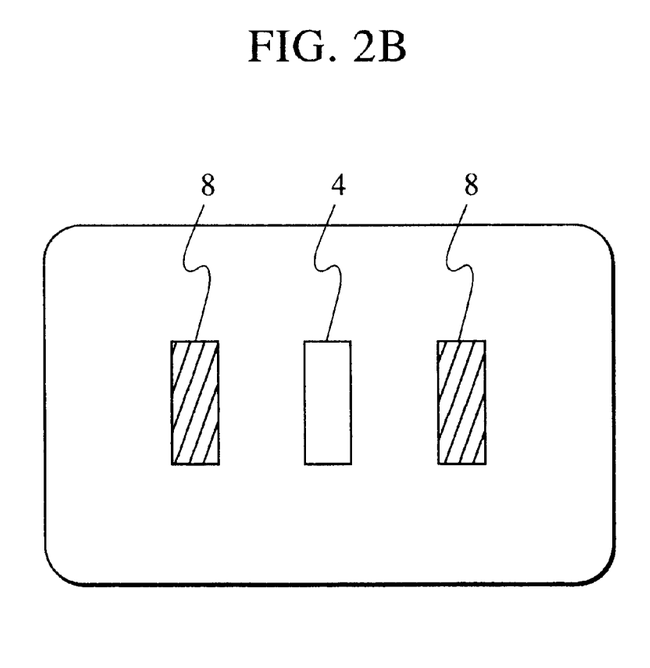

FIG. 2B shows the images of the wafer position detecting mark 4 and the reference alignment marks 8 detected by the image pickup device 15. By performing image processing, for example, the image processing disclosed in the foregoing U.S. Patent, on the image information obtained by the image pickup device 15, it is possible to determine the position of the wafer position detecting mark 4, that is, the position of the wafer 2 with respect to the reference alignment marks 8. The positional relationship between the reference alignment marks 8 and 9 on the plate 7 are known beforehand, so that, by detecting the positional deviation of the mask position detecting mark 3 and the wafer position detecting mark 4 corresponding to the reference alignment marks 8 and 9, respectively, it is possible to finally ascertain the positional relationship between the mask 1 and the wafer 2 by taking into account the positional relationship between the reference alignment marks and the detected positional deviations, whereby the alignment of the mask 1 and the wafer 2 can be effected.

The relationship between the reference alignment marks 8 and 9 is determined in correspondence with the distance between the mask 1 and the wafer 2, which are the objects to be aligned. In order that the relative arrangement of the reference alignment marks 8 and 9 may differ when the distance between the mask 1 and the wafer 2 differs, a reference alignment mark, for example, is replaced or positionally adjusted. Thus, in the alignment device of the present invention, the construction of the reference alignment marks 8 and 9 arranged on the plate 7 can be made different in accordance with the condition of the objects to be aligned. Since the condition of the objects is known beforehand, it is possible to prepare in advance the reference alignment marks in the device. This advantage comes from the fact that the reference alignment marks (8 and 9) are provided in the device as separate references (i.e., separate from marks 3 and 4), making it possible for the device to cope with various alignment conditions.

In FIG. 1, the image signals from the image pickup devices 13 and 15 are taken in by a computing unit 18, and, on the basis of the image signals, the positional deviation between the mask 1 and the wafer 2 is detected. The detected positional deviation is converted to a command signal for actuators 19 and 20, and a mask holder 21 and a wafer stage 22 are driven to set the positional deviation between the mask 1 and the wafer 2 to a desired accuracy.

Figure 3:
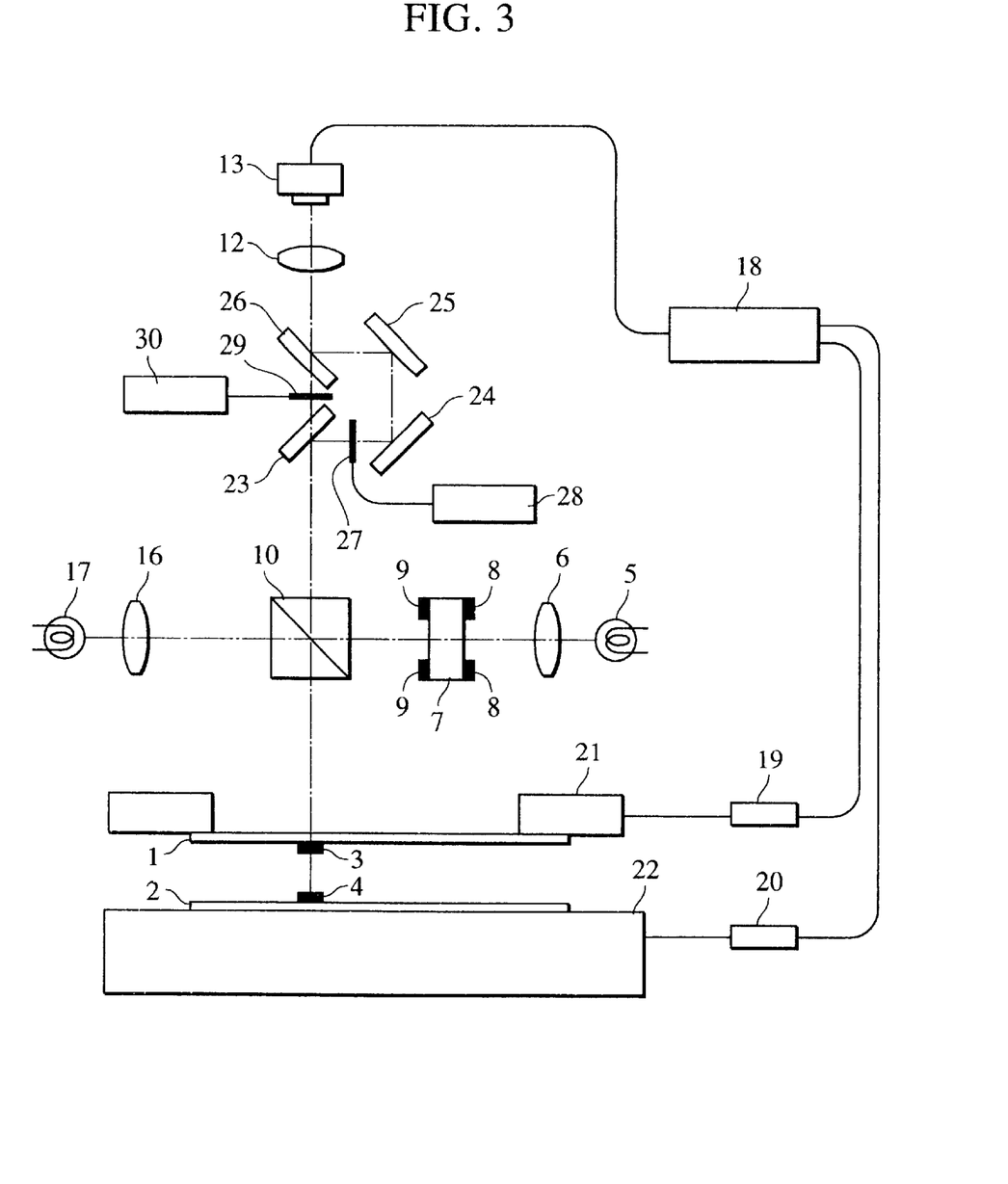
FIG. 3 is a schematic diagram of a main part of a device according to a second embodiment of the present invention.

FIG. 3 shows a second embodiment of the present invention. The components which are the same as those of the first embodiment are indicated by the same reference numerals. On the mask 1 and the wafer 2 arranged opposite to each other with a predetermined space therebetween, there are arranged the mask position detecting mark 3 and the wafer position detecting mark 4, respectively, and an illuminating beam from the light source 17 is applied to these position detecting marks through the illuminating optical system 16 and the beam splitter 10. The image of the mask position detecting mark 3 for the mask, thus illuminated, is formed on the image pickup device 13 through the beam splitter 10, half mirrors 23, 24, 25 and 26, and the imaging system 12.

The reference alignment marks 9 arranged on the plate 7 are illuminated by the light source 5 through the illumination optical system 6. The images of the reference alignment marks 9 are reflected by the beam splitter 10, and then are formed on the same image pickup device 13 through the beam splitter 10, the half mirrors 23, 24, 25 and 26, and the imaging system 12.

The illuminating beam from the light source 17 is applied to the wafer position detecting mark 4 through the illumination optical system 16 and the beam splitter 10. The image of the wafer position detecting mark 4 is transmitted via the beam splitter 10 and the half mirrors 23 and 26 and is formed on the image pickup device 13.

The light source 5 illuminates the reference alignment marks 8 arranged on the plate 7 through the illumination optical system 6. The images of the reference alignment marks 8 are reflected by the beam splitter 10, and are transmitted through the half mirrors 23 and 26 before they are formed on the same image pickup device 13 through the imaging system 12. Reference numerals 27 and 29 indicate optical path switching shutters.

The positional relationship between the reference alignment marks 8 and 9 on the plate 7 is known beforehand, so that, by detecting the positional deviation of the alignment marks on the mask and the wafer (3 and 4) corresponding to the reference alignment marks (8 and 9), it is possible to eventually ascertain the positional relationship between the mask 1 and the wafer 2, thereby making it possible to perform alignment of the mask 1 and the wafer 2.

Figure 4:
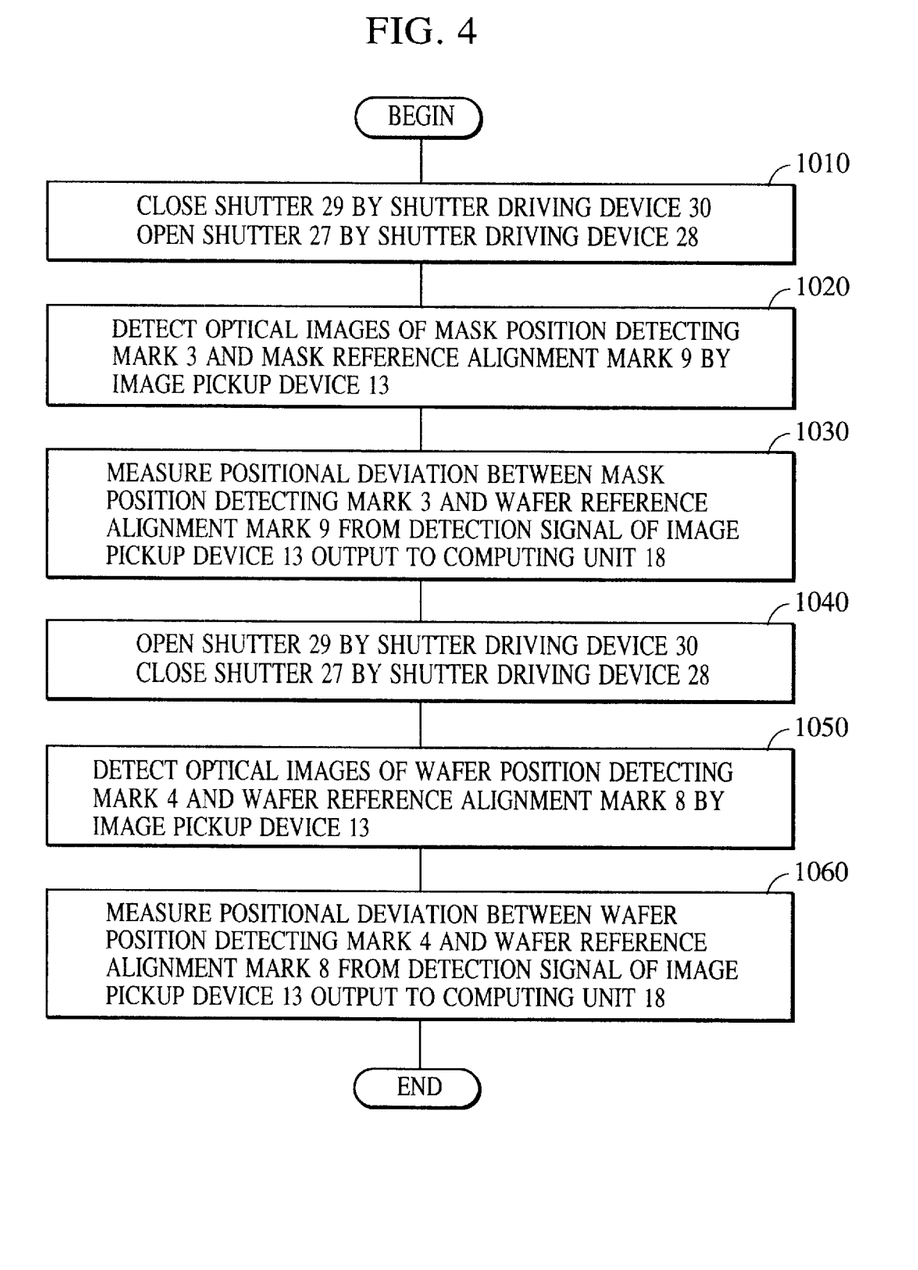
FIG. 4 is a flowchart showing a measurement sequence of the second embodiment.

The flowchart of FIG. 4 shows the measurement sequence of the reference alignment marks (8 and 9) and the position detecting marks (3 and 4) on the mask and the wafer. In accordance with the mark to be detected, the shutters 27 and 29 are alternately opened and closed by shutter driving devices 28 and 30. The optical paths selected by the shutters 27 and 29 are adjusted and set beforehand such that one optical path has an optical path length which allows formation of optical images of the mask position detecting mark 3 and the reference alignment marks 9, and that the other optical path has an optical path length which allows formation of optical images of the wafer position detecting mark 4 and the reference alignment marks 8. Thus, even when one imaging system and one image pickup device are used, it is possible to independently detect the positions of the mask 1 and the wafer 2 in accordance with the opening and closing of the shutters 27 and 29.

(In more detail, in FIG. 4, in step 1010, the shutter 29 is closed by the shutter driving device 30 and the shutter 27 is opened by the shutter driving device 28; in step 1020, the image pickup device 13 detects optical images of the mask position detecting mark 3 and mask reference alignment mark 9; in step 1030, on the basis of the resulting signal output from the image pickup device 13 to the computing unit 18, the computing unit 18 determines the positional deviation between the mask position detecting mark 3 and the mask reference alignment mark 9; in step 1040, the shutter 29 is opened by the shutter driving device 30 and the shutter 27 is closed by the shutter driving device 28; in step 1050, the image pickup device 13 detects optical images of the wafer position detecting mark 4 and the wafer reference alignment mark 8; and in step 1060, on the basis of the resulting signal output from the image pickup device 13 to the computing unit 18, the computing unit 18 determines the positional deviation between the wafer position detecting mark 4 and the wafer reference alignment mark 8.)

In FIG. 3, an image signal from the image pickup device 13 is taken in by the computing unit 18, and, on the basis of this image signal, the positional deviation between the mask 1 and the wafer 2 is detected. The deviation detected is converted to a command signal for the actuators 19 and 20, and the mask holder 21 and the wafer stage 22 are driven, making it possible for the positional deviation of the mask 1 and the wafer 2 to be set to a value within a desired level of accuracy. While in this embodiment described above, the optical path is adjusted and set for each mark in order that optical images of a plurality of marks arranged at different gap positions may be detected by one detection system, it is also possible to make the magnification of the imaging system 12 variable so as to adjust for the variation in the optical path length.

Figure 5:
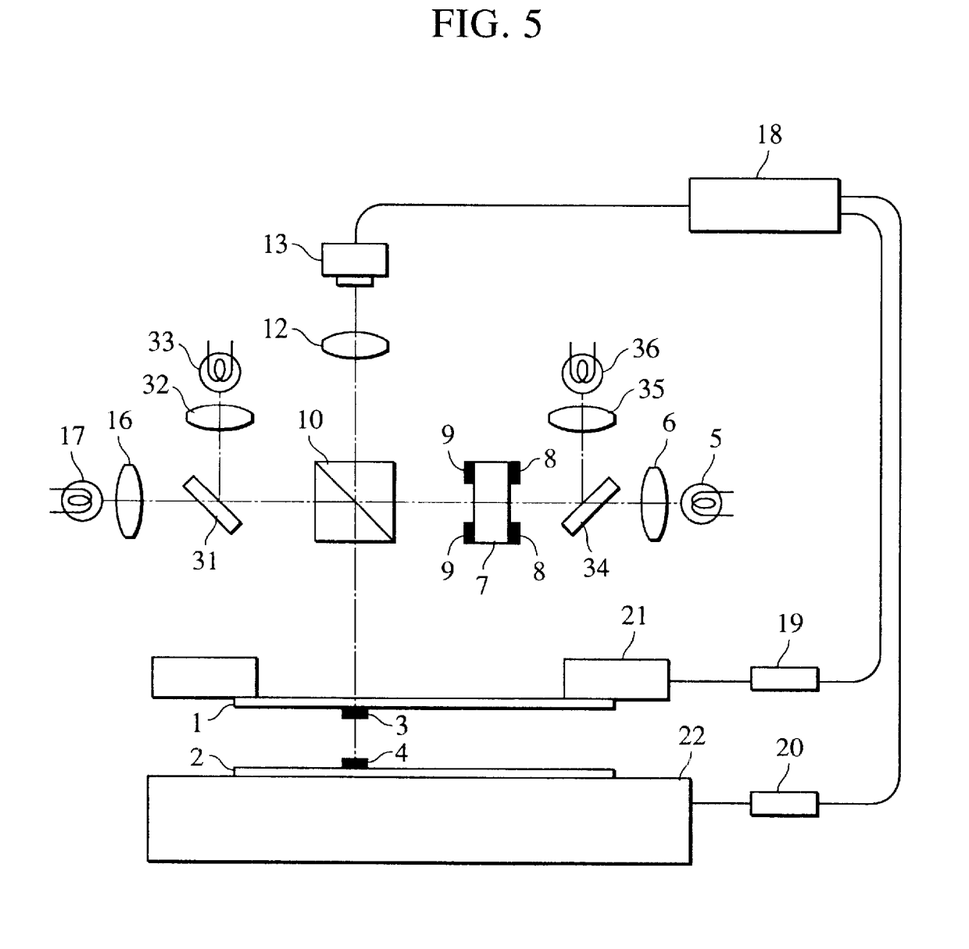
FIG. 5 is a schematic diagram of a main part of a device according to a third embodiment of the present invention.

FIG. 5 shows a third embodiment of the present invention. The components which are the same as those of the above embodiments are indicated by the same reference numerals.

The mask position detecting mark 3 and the wafer position detecting mark 4 are arranged on the mask 1 and the wafer 2, respectively, which are arranged opposite to each other with a predetermined space therebetween. An illuminating beam from the light source 17 having a wavelength $\lambda 1$ is applied to the mask position detecting mark 3 through the illumination optical system 16, the half mirror 31 and the beam splitter 10. The image of the mask position detecting mark 3 is formed on the image pickup device 13 through the beam splitter 10 and the imaging system 12.

The reference alignment marks 9 arranged on the plate 7 are illuminated through the illumination optical system 6 (and a beam splitter 34) with an illuminating beam from the light source 5 having the same wavelength $\lambda 1$ as the light source 17. The images of the reference alignment marks 9 are reflected by the beam splitter 10, and then are formed on the same image pickup device 13 through the beam splitter 10 and the imaging system 12.

An illuminating beam from a light source 33 having a wavelength $\lambda 2$ is applied to the wafer position detecting mark 4 through an illumination optical system 32, the half mirror 31 and the beam splitter 10. The image of the wafer position detecting mark 4 is formed on the image pickup device 13 through the beam splitter 10 and the imaging system 12.

An illuminating beam from a light source 36 having the same wavelength $\lambda 2$ as the light source 33 is applied to the reference alignment marks 8 arranged on the plate 7 through an illumination optical system 35 (and the beam splitter 34). The images of the reference alignment marks 8 are reflected by the beam splitter 10 and are formed on the same image pickup device 13 through the imaging system 12.

The positional relationship between the reference alignment marks 8 and 9 on the plate 7 is known beforehand, so that, by detecting the positional deviation of the alignment marks of the mask and the wafer (i.e., 3 and 4) corresponding to the reference alignment marks (i.e., 8 and 9), it is possible to eventually ascertain the positional relationship between the mask 1 and the wafer 2, whereby alignment of the mask 1 and the wafer 2 can be conducted.

In this embodiment, an optical image from a plurality of marks at different gap positions is detected by one imaging system 12 and one image pickup device 13. The imaging system 12 is set such that the chromatic aberration characteristics of the wavelength $\lambda 1$ of the illuminating beam applied to the mask position detecting mark 3 and the reference alignment marks 9 and the wavelength $\lambda 2$ of the illuminating beam applied to the wafer position detecting mark 4 and the reference alignment marks 8 are cancelled with respect to the gap between the mask 1 and the wafer 2 and that the images are formed at the same position regarding the direction along an optical axis of the imaging system 12, i.e., on the same image pickup device 13.

The image signal from the image pickup device 13 is taken in by the computing unit 18, and, on the basis of this image signal, the positional deviation of the mask 1 and the wafer 2 is detected. The deviation detected is converted to a command signal for the actuators 19 and 20, and the mask holder 21 and the wafer stage 22 are driven to set the positional deviation of the mask 1 and the wafer 2 to a value within a desired level of accuracy.

While in this embodiment the mask position detecting mark 3 and the reference alignment marks 9 are illuminated with the wavelength $\lambda 1$, and the wafer position detecting mark 4 and the reference alignment marks 8 are illuminated with the wavelength $\lambda 2$, it is also possible to vary the wavelength of illumination for each mark.

A fourth embodiment is the same as the first through third embodiments except for the timing with which the positional deviation is detected. In the first through third embodiments, the wafer 2 is arranged opposite to the mask 1 when detecting the positional deviation of the mask position detecting mark 3 and the reference alignment marks 9. However, it is also possible for the detection to be conducted in the condition in which the wafer 2 is not under the mask 1. Similarly, while in the first through third embodiments the optical image of the wafer position detecting mark 4 is observed through the transmitting section of the mask 1 when detecting the positional deviation of the wafer position detecting mark 4 and the reference alignment marks 8, it is also possible to perform the detection without observing through the mask 1.

A fifth embodiment is the same as the first through fourth embodiments except for the timing with which the positional deviation is detected. In the first through fourth embodiments, alignment is effected by detecting the relative position of the mask or the wafer with respect to the reference alignment marks. However, if there is no change in the positional relationship between the position detecting mark 3 for the mask, reference alignment marks 9, the imaging system and the image pickup device, there is no need to perform the detection of the relative positions of the marks 3 and 9 for each shot. In this case, the detection of the relative positions of the wafer position detecting mark 4 and the reference alignment marks 8 is conducted for each wafer or for each shot.

Figure 6:
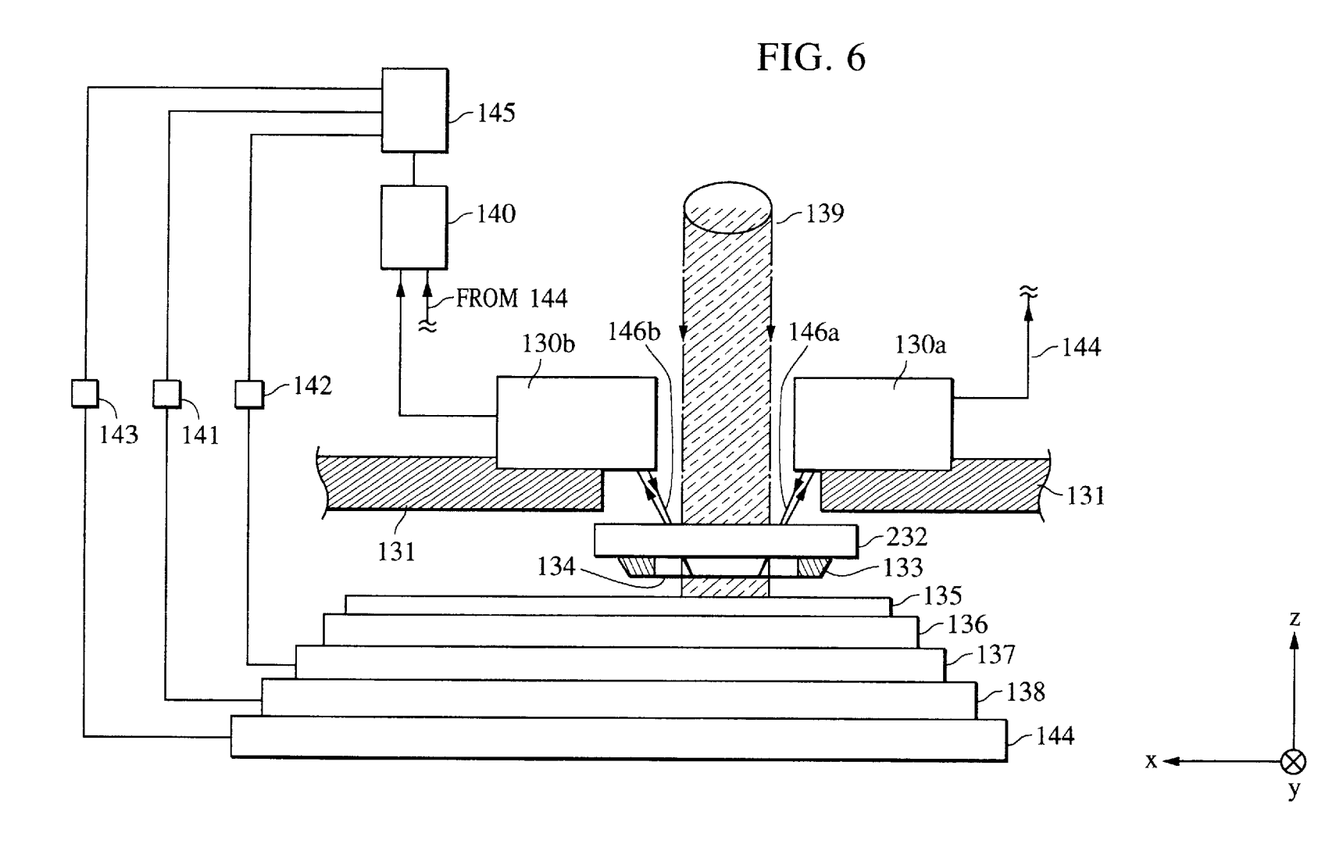
FIG. 6 is a schematic diagram of a main part of a semiconductor exposure device to which the present invention is applied.

FIG. 6, which shows a sixth embodiment of present invention, is a schematic diagram of a the main parts of position detecting device of the present invention as applied to an exposure device for manufacturing semiconductor devices utilizing X-rays. In the drawing, the X-ray source, X-ray illumination system, etc., are omitted for the sake of simplification. In the drawing, numeral 139 indicates an X-ray beam, which is applied to the surface of a mask 134. Numeral 133 indicates a mask frame, numeral 134 indicates a mask layer (i.e., the mask), and numeral 135 indicates a wafer to which an X-ray resist is applied and on the surface of which IC patterning is effected by an X-ray absorber. Numeral 232 indicates a mask support, numeral 136 indicates a wafer fixing member such as a wafer chuck, and numeral 137 indicates a Z-axis stage which can be tilted. Numeral 138 indicates an X-axis stage; and numeral 144 indicates a Y-axis stage. The positional deviation detectors as described with reference to the above embodiments are accommodated in casings 130a and 130b, detecting the gap between the mask 134 and the wafer 135 and information on their positional deviation in the x and y-direction. Although FIG. 6 shows only two positional deviation detectors 130a and 130b, two additional positional deviation detectors, i.e., four in total, are provided in correspondence with the sides of the IC pattern areas in the four corners on the mask 134. Numerals 146a and 146b indicate positional deviation detecting beams, representing the beams emitted from the optical systems and incident on the detection systems accommodated in the casings 130a and 130b.

A signal obtained by the positional deviation detectors is processed by a processing means 140 to obtain any deviation in the x and y-planes and a gap distance (Z direction). When it is determined that the results obtained are not within the predetermined values, the stage driving systems 141, 142 and 143 of the X, Z, and Y stages, respectively, are driven to set the mask and the wafer to be within a predetermined deviation range. When effecting this setting, the offset of the correction amount of the alignment error due to the influence of the exposure distortion is taken into account, and the mask 134 is moved through a mask driving system (not shown) of the mask support or the wafer 135 is moved to thereby adjust the positional relationship between them. After this, an X-ray beam 139 is applied to the mask 134. When the result obtained by the processing means 140 is within the predetermined value, the positional relationship is not adjusted. In that case, the application of X-rays can be immediately effected. Until the alignment operation has been completed, the X-rays are blocked by an X-ray intercepting member (not shown).

Figure 7:
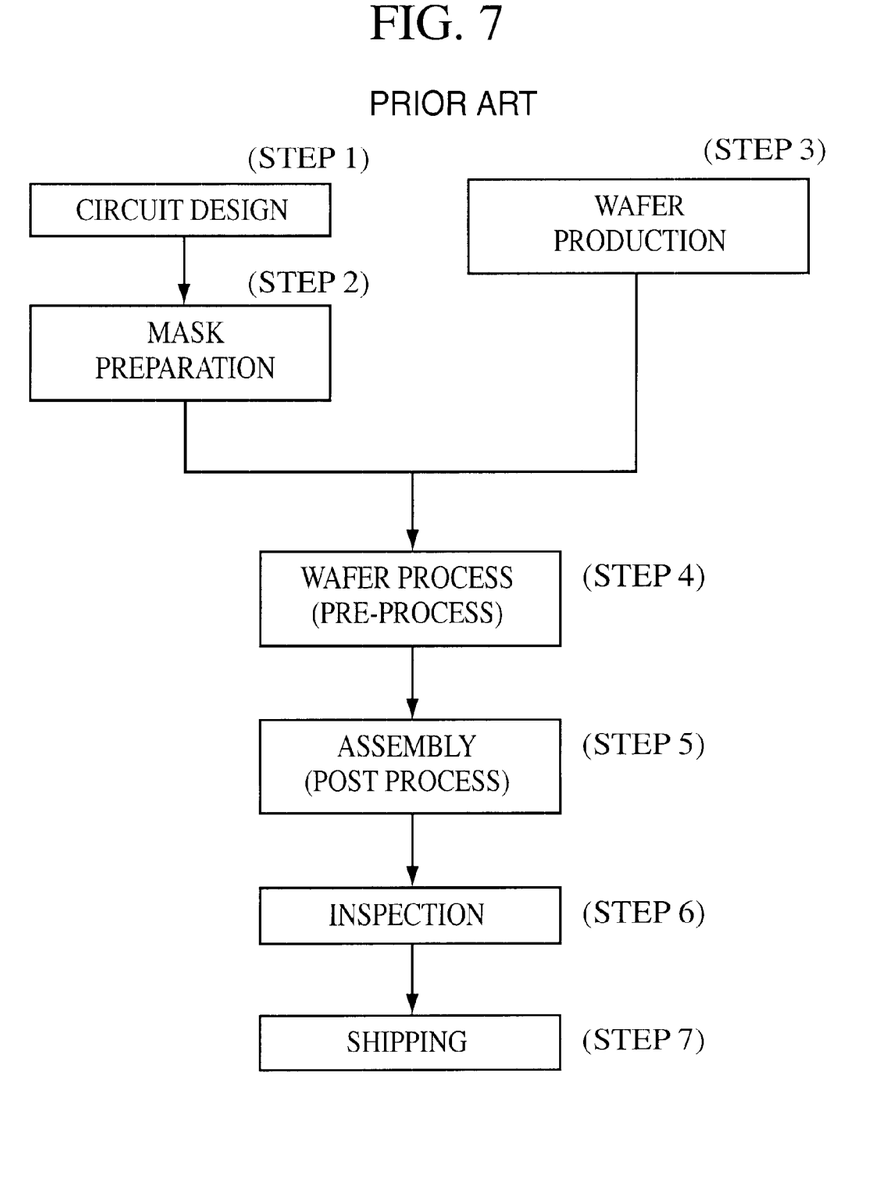
FIG. 7 is a flowchart of a semiconductor device manufacturing method according to the present invention.

Next, an embodiment of a semiconductor device manufacturing method utilizing the above-described exposure device will be described. FIG. 7 is a flowchart showing a production flow of semiconductor devices (semiconductor chips of ICs, LSIs, etc., or liquid crystal panels, CCDs, etc.). In step 1 (circuit design), the circuit design of the semiconductor device is conducted. In step 2 (mask production), a mask is prepared on which the designed circuit pattern is formed.

In step 3 (wafer production), a wafer is produced by using a material such as silicon. Step 4 (wafer process) is called a pre-process, in which a circuit is actually formed on the wafer by lithography using the mask and the prepared wafer. The next step 5 (assembly) is called a post process, in which semiconductor chips are obtained by using the wafer prepared in step 4. This step includes an assembly process (dicing, bonding), a packaging process (chip sealing), etc. In step 6, the semiconductor devices prepared in step 5 are subjected to inspection, such as an operation checking test and a durability test. Through these processes, the semiconductor devices are completed and shipped (Step 7).

Figure 8:
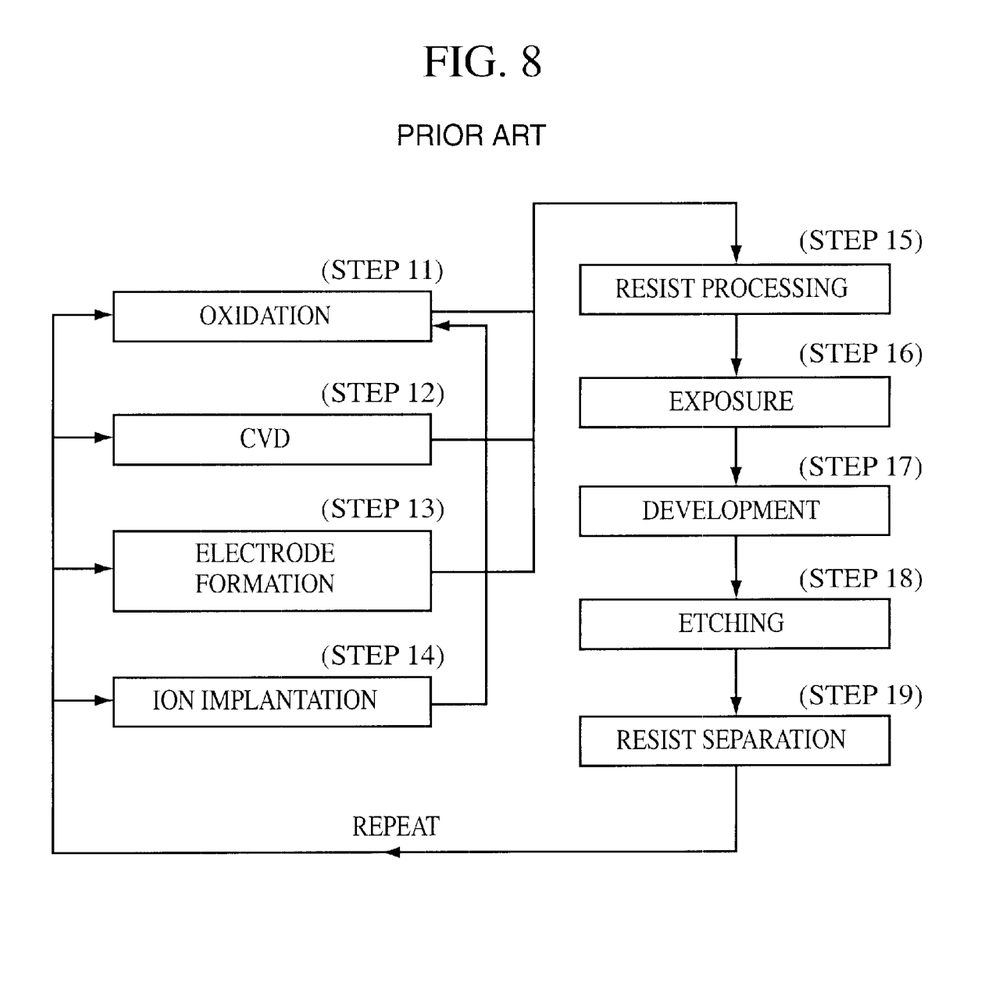
FIG. 8 is a flowchart of a semiconductor device manufacturing method according to the present invention.

FIG. 8 is a detailed flowchart showing the above wafer process (i.e., step 4). In step 11 (oxidation), the surface of the wafer is oxidized. In step 12 (CVD), an insulating film is formed on the wafer surface.

In step 13 (electrode formation), electrodes are formed on the wafer by evaporation. In step 14 (ion implantation), ions are implanted in the wafer. In step 15 (resist processing), a photosensitive material is applied to the wafer. In step 16 (exposure), the circuit pattern of the mask is printed and exposed by the above-described exposure device.

In step 17 (development), the exposed wafer is developed. In step 18 (etching), the portion other than the developed resist image is cut off. In step 19 (resist separation), the resist which has become unnecessary after the etching is removed. By repeating these processes, a multiplex circuit pattern is formed on the wafer.

By using the production method and production device of this embodiment, a highly integrated semiconductor device, which has been difficult to produce, can be easily produced.

As described above, in a position detecting method and a position detecting device in which the relative positions of a mask and a wafer, which are arranged opposite to each other and which constitute first and second objects, are detected, a third object having separate reference alignment marks in correspondence with the position detecting marks arranged on the first and second objects is provided. Optical images of the reference alignment marks on the third object and the position detecting marks on the first and second objects are detected by an image pickup device, whereby it is possible to apply an image processing method, which is the most reliable alignment method, to the alignment method and the alignment device. Thus, it is possible to achieve a highly accurate position detection, which characterizes the image processing method. Further, since the construction and arrangement of the reference alignment marks can be adjusted in the device, it is possible to construct an alignment method and an alignment device which provide a high degree of freedom with respect to the arrangement of the first and second objects.

Further, since such a high level of accuracy in alignment is achieved in the semiconductor device, which has been conventionally impossible, it is possible to provide a semiconductor device of high performance.

Except as otherwise disclosed herein, the various components shown in outline or in block form in the figures are individually well-known and their internal construction and operation are not critical either to the making or using of this invention or to a description of the best mode of the invention.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A position detecting device for detecting a positional relationship between first and second objects arranged opposite to each other by using a first position detecting mark arranged on the first object and a second position detecting mark arranged on the second object, said position detecting device comprising:

a first illumination and projection system for illuminating the first position detecting mark and the second position detecting mark and for projecting a first projected image of the first position detecting mark and the second position detecting mark;

a reference member having alignment reference marks corresponding to the first and second position detecting marks;

a second illumination and projection system for illuminating the alignment reference marks and for projecting a second projected image of the alignment reference marks; and an image taking system for receiving the first projected image of the first and second position detecting marks and the second projected image of the alignment reference marks, wherein the positional relationship between the first projected image of the first position detecting mark and the second projected image of the alignment reference marks of said reference member is detected by using said image taking system, and wherein the positional relationship between the first projected image of the second position detecting mark and the second projected image of the alignment reference marks is detected by using said image taking system, whereby the detection of relative positions of the first and second objects is executed.

2. A device according to claim 1, wherein said reference member is arranged within said position detecting device.

3. A device according to claim 2, wherein said alignment reference marks include a first alignment mark for alignment with the first position detecting mark, and a second alignment mark for alignment with the second position detecting mark.

4. A device according to claim 3, wherein the first and second position detecting marks are arranged in correspondence with the distance between the first and second objects.

5. A device according to claim 3, wherein the first and second alignment marks are arranged in accordance with an intended distance between the first and second objects.

6. A device according to claim 3, wherein said image taking system includes a first image pickup device for detecting optical images of the first position detecting mark and the first alignment mark, and a second image pickup device for detecting optical images of the second position detecting mark and the second alignment mark.

7. A device according to claim 6, wherein said first image pickup device is separate from said second image pickup device.

8. A device according to claim 3, wherein said image taking system performs the detection of optical images of the first position detecting mark and the first alignment mark and the detection of optical images of the second position detecting mark and the second alignment mark under different optical conditions.

9. A device according to claim 8, wherein said different optical conditions are obtained by switching between a first optical path for detecting the optical images of the first position detecting mark and the first alignment mark and a second optical path for detecting the optical images of the second position detecting mark and the second alignment mark.

10. A device according to claim 9, wherein said image taking system has only one image pickup device for detecting the optical images of the first position detecting mark and the first alignment mark and the second position detecting mark and the second alignment mark.

11. A device according to claim 9, wherein when the first optical path is used, the optical images of the first position detecting mark and the first alignment mark, and not those of the second position detecting mark and the second alignment mark, are formed on an image pickup device of said image taking system, and wherein when the second optical path is used, the optical images of the second position detecting mark and the second alignment mark, and not those of the first position detecting mark and the first alignment mark, are formed on an image pickup device of said image taking system.

12. A device according to claim 8, wherein said first and second illumination and projection systems are configured so that the different optical conditions are obtained by making the wavelength of the light for detecting the optical images of the first position detecting mark and the first alignment mark different from the wavelength of the light for detecting the optical images of the second position detecting mark and the second alignment mark.

13. A device according to claim 1, wherein said reference member is separate from the first and second objects, and said first illumination system is separate from said second illumination system.

14. An exposure device for transferring a pattern of a first object through exposure onto a second object after performing alignment of the first and second objects, which objects are arranged opposite to each other, by detecting a positional relationship between the first and second objects by using a first position detecting mark arranged on the first object and a second position detecting mark arranged on the second object, said exposure device comprising:

a first illumination and projection system for illuminating the first position detecting mark and the second position detecting mark and for projecting a first projected image of the first position detecting mark and the second position detecting mark;

a reference member having alignment reference marks respectively corresponding to the first and second position detecting marks;

a second illumination and projection system for illuminating the alignment reference marks and for projecting a second projected image of the alignment reference marks; and an image taking system for receiving the first projected image of the first and second position detecting marks and the second projected image of the alignment reference marks, wherein a positional relationship between the first projected image of the first position detecting mark and the second projected image of the alignment reference marks is detected by using said image taking system, and wherein a positional relationship between the first projected image of the second position detecting mark and the second projected image of the alignment reference marks is detected by using said image taking system, whereby the detection of relative positions of the first and second objects is executed.

15. A device according to claim 14, wherein said reference member is arranged within said exposure device.

16. A device according to claim 15, wherein the alignment reference marks include a first alignment mark for alignment with the first position detecting mark, and a second alignment mark for alignment with the second position detecting mark.

17. A device according to claim 16, wherein the first and second alignment marks are arranged in correspondence with the distance between the first and second objects.

18. A device according to claim 16, wherein said image taking system performs the detection of optical images of the first position detecting mark and the first alignment mark and the detection of optical images of the second position detecting mark and the second alignment mark under different optical conditions.

19. A device according to claim 18, wherein the different optical conditions are obtained by switching between a first optical path for detecting the optical images of the first position detecting mark and the first alignment mark and a second optical path for detecting the optical images of the second position detecting mark and the second alignment mark.

20. A device according to claim 19, further comprising means for switching between the first optical path and the second optical path by using optical path switching shutters.

21. A device according to claim 18, wherein said first and second illumination and projection systems are configured so that the different optical conditions are obtained by making the wavelength of the light for detecting the optical images of the first position detecting mark and the first alignment mark different from the wavelength of the light for detecting the optical images of the second position detecting mark and the second alignment mark.

22. A device according to claim 16, wherein said image taking system includes a first image pickup device for detecting optical images of the first position detecting mark and the first alignment mark, and a second image pickup device for detecting optical images of the second position detecting mark and the second alignment mark.

23. A device for detecting alignment, in an optical axis direction, of a mask having a mask alignment mark and a wafer having a wafer alignment mark, the mask and the wafer being arranged along the optical axis spaced apart from and facing one another, said device comprising:

a plate separate from the mask and the wafer and having a mask reference mark and a wafer reference mark;

an optical system for illuminating the mask alignment mark of the mask and the wafer alignment mark of the wafer with a first light source and for illuminating the mask reference mark of said plate and the wafer reference mark of said plate with a second light source separate from the first light source, and for forming images of the mask alignment mark and the mask reference mark on a first image pickup device and for forming images of the wafer alignment mark and the wafer reference mark on a second image pickup device separate from the first image pickup device; and a detector for detecting a first positional deviation between the mask alignment mark and the mask reference mark on the basis of a signal from the first image pickup device corresponding to the images thereof, for detecting a second positional deviation between the wafer alignment mark and the wafer reference mark on the basis of a signal from the second image pickup device corresponding to the images thereof, and for detecting a positional deviation in the optical axis direction between the mask and the wafer in accordance with the first and second positional deviations.

24. A position detecting device for detecting a positional relationship between first and second objects arranged opposite to each other by using a first position detecting mark arranged on the first object and a second position detecting mark arranged on the second object, said position detecting device comprising:

a first illumination and projection system for illuminating the first position detecting mark and the second position detecting mark and for projecting a first projected image of the first position detecting mark and the second position detecting mark;

a reference member arranged within said position detecting device having alignment reference marks corresponding to the first and second position detecting marks, the alignment reference marks including a first alignment mark for alignment with the first position detecting mark and a second alignment mark for alignment with the second position detecting mark;

a second illumination and projection system for illuminating the alignment reference marks and for projecting a second projected image of the alignment reference marks; and an image taking system for receiving the first projected image of the first and second position detecting marks and the second projected image of the alignment reference marks, said image taking system switching between a first optical path for detecting optical images of the first position detecting mark and the first alignment mark and a second optical path for detecting optical images of the second position detecting mark and the second alignment mark, wherein the positional relationship between the first projected image of the first position detecting mark and the second projected image of the alignment reference marks of said reference member is detected by using said image taking system, and the positional relationship between the first projected image of the second position detecting mark and the second projected image of the alignment reference marks is detected by using said image taking system, whereby the detection of relative positions of the first and second objects is executed.

25. A device according to claim 24, wherein said image taking system has only one image pickup device for detecting the optical images of the first position detecting mark and the first alignment mark and the second position detecting mark and the second alignment mark.

26. A device according to claim 24, wherein when the first optical path is used, the optical images of the first position detecting mark and the first alignment mark, and not those of the second position detecting mark and the second alignment mark, are formed on an image pickup device of said image taking system, and when the second optical path is used, the optical images of the second position detecting mark and the second alignment mark, and not those of the first position detecting mark and the first alignment mark, are formed on an image pickup device of said image taking system.

27. A position detecting device for detecting a positional relationship between first and second objects arranged opposite to each other by using a first position detecting mark arranged on the first object and a second position detecting mark arranged on the second object, said position detecting device comprising:

a first illumination system for illuminating the first position detecting mark and the second position detecting mark;

a reference member arranged within said position detecting device having alignment reference marks corresponding to the first and second position detecting marks, the alignment reference marks including a first alignment mark for alignment with the first position detecting mark and a second alignment mark for alignment with the second position detecting mark;

a second illumination system for illuminating the alignment reference marks; and an image taking system for taking optical images of the first and second position detecting marks and optical images of the alignment reference marks, wherein said first and second illumination systems are configured so that a wavelength of light for detecting optical images of the first position detecting mark and first alignment mark is different from the wavelength of the light for detecting optical images of the second position detecting mark and the second alignment mark, the positional relationship between the optical image of the first position detecting mark and the optical images of the alignment reference marks of said reference member is detected by using said image taking system, and the positional relationship between the optical image of the second position detecting mark and the optical images of the alignment reference marks is detected by using said image taking system, whereby the detection of the relative positions of the first and second objects is executed.

28. An exposure device for transferring a pattern of a first object through exposure onto a second object after performing alignment of the first and second objects, which objects are arranged opposite to each other, by detecting a positional relationship between the first and second objects by using a first position detecting mark arranged on the first object and a second position detecting mark arranged on the second object, said exposure device comprising:

a first illumination system for illuminating the first position detecting mark and the second position detecting mark;

a reference member arranged within said exposure device having alignment reference marks respectively corresponding to the first and second position detecting marks, the alignment reference marks including a first alignment mark for alignment with the first position detecting mark and a second alignment mark for alignment with the second position detecting mark;

a second illumination system for illuminating the alignment reference marks; and an image taking system for taking optical images of the first and second position detecting marks and optical images of the alignment reference marks, wherein said first and second illumination systems are configured so that a wavelength of light for detecting optical images of the first position detecting mark and the first alignment mark is different from the wavelength of light for detecting optical images of the second position detecting mark and the second alignment mark, a positional relationship between the optical image of the first position detecting mark and the optical images of the alignment reference marks is detected by using said image taking system, and a positional relationship between the optical image of the second position detecting mark and the optical images of the alignment reference marks is detected by using said image taking system, whereby the detection of the relative positions of the first and second objects is executed.

* * * * *